United States Patent
Kinoshita et al.

(10) Patent No.: US 6,370,764 B1
(45) Date of Patent: *Apr. 16, 2002

(54) ELECTRONIC-PARTS MOUNTING APPARATUS

(75) Inventors: Yoichi Kinoshita; Takashi Munezane; Kunio Tanaka, all of Osaka; Shigeki Nakatsuka, Kyoto; Toshihiko Nagaya, Osaka, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/258,796

(22) Filed: Mar. 1, 1999

(30) Foreign Application Priority Data

Mar. 3, 1998 (JP) .......................................... 10-050453

(51) Int. Cl.[7] ................................................ H05K 3/30
(52) U.S. Cl. ............................. 29/740; 29/739; 29/721; 29/741; 29/743; 29/DIG. 44; 414/737
(58) Field of Search .......................... 29/739–741, 832, 29/743, DIG. 44, 721, 759; 414/737

(56) References Cited

U.S. PATENT DOCUMENTS

| | | | | |
|---|---|---|---|---|
| 3,279,044 A | * | 10/1966 | Roper .......................... | 29/739 |
| 4,515,507 A | * | 5/1985 | Asai et al. ................... | 414/226 |
| 4,606,117 A | * | 8/1986 | Takahashi et al. ............ | 29/740 |
| 4,794,689 A | * | 1/1989 | Seno et al. .................... | 29/740 |
| 4,807,356 A | * | 2/1989 | Maruyama et al. ........... | 29/740 |
| 4,860,438 A | * | 8/1989 | Chen ........................... | 29/740 |
| 4,951,388 A | * | 8/1990 | Eguchi et al. ................. | 29/832 |
| 4,979,286 A | * | 12/1990 | Nakayama et al. ........... | 29/740 |
| 5,058,263 A | * | 10/1991 | Corbeij et al. ................ | 29/740 |
| 5,060,366 A | * | 10/1991 | Asai et al. .................... | 29/739 |
| 5,070,598 A | * | 12/1991 | Itagaki et al. ................. | 29/705 |
| 5,136,776 A | * | 8/1992 | Yamagisawa ................. | 29/740 |
| 5,255,429 A | * | 10/1993 | Nishi et al. ................... | 29/720 |
| 5,290,134 A | * | 3/1994 | Baba .......................... | 414/404 |
| 5,421,696 A | * | 6/1995 | Stephan et al. .............. | 414/751 |
| 5,491,888 A | | 2/1996 | Otha et al. | |
| 5,544,411 A | * | 8/1996 | Kano et al. ................... | 29/740 |
| 5,864,944 A | | 2/1999 | Morita et al. | |
| 6,000,123 A | * | 12/1999 | Munezane et al. ........... | 29/740 |

FOREIGN PATENT DOCUMENTS

| | | |
|---|---|---|
| EP | 0664 665 | 7/1995 |
| EP | 0664 666 | 7/1995 |

\* cited by examiner

Primary Examiner—Peter Vo
Assistant Examiner—Minh Trinh
(74) Attorney, Agent, or Firm—Louis Woo (57) ABSTRACT

An electronic-parts mounting apparatus includes an electronic-parts feeder. A mounting head operates for carrying electronic parts from the electronic-parts feeder. The mounting head includes a plurality of nozzles for holding the electronic parts respectively. An electronic-parts mounting portion operates for enabling the mounting head to mount the electronic parts on a circuit board. A first mechanism operates for rotating each of the nozzles. A second mechanism operates for moving each of the nozzles upward and downward. The first mechanism may include a pinion provided on an outer circumferential surface of each of the nozzles, and a rack meshing with the pinion.

21 Claims, 14 Drawing Sheets

ELECTRONIC-PARTS MOUNTING APPARATUS

BACKGROUND OF THE INVENTION

1. Field of the Invention

This invention relates to an apparatus for automatically mounting electronic parts on a printed circuit board.

2. Description of the Related Art

A known electronic-parts mounting apparatus includes an electronic-parts feeder, a mounting head, and a mounting portion. A printed circuit board is placed in position within the mounting portion. The mounting head carries electronic components (electronic parts) from the electronic-parts feeder to the mounting portion, and mounts the electronic components on the printed circuit board. The mounting portion is provided with an XY table for moving the printed circuit board in two perpendicular directions on a horizontal plane. The XY table is rotatable.

In the known electronic-parts mounting apparatus, the XY table is rotated from a normal position when the actual posture of an electronic component held by the mounting head differs from a desired posture, or when an electronic component is required to be obliquely mounted on the printed circuit board. Specifically, in the case where the actual posture of an electronic component held by the mounting head differs from a desired posture, the electronic component is carried to a place above the printed circuit board in the mounting portion while the actual posture thereof remains different from the desired posture. The XY table is rotated from its normal position to compensate for the error in the posture of the electronic component held by the mounting head. Then, the mounting head is lowered toward the printed circuit board, and the electronic component is mounted thereon by the mounting head.

The postural error compensation using rotation of the XY table causes a long mounting time to be spent per electronic component. The reason for the long mounting time is as follows. The XY table is large and heavy. Therefore, the time interval between the moment of start of rotation of the XY table and the moment of stop thereof is relatively long. After the stop of rotation of the XY table has been completed, the mounting head commences to be lowered toward the printed circuit board. Accordingly, the known electronic-parts mounting apparatus tends to be low in mounting speed or rate.

SUMMARY OF THE INVENTION

It is an object of this invention to provide an electronic-parts mounting apparatus having a high mounting speed or rate.

A first aspect of this invention provides an electronic-parts mounting apparatus comprising an electronic-parts feeder; a mounting head for carrying electronic parts from the electronic-parts feeder, the mounting head including a plurality of nozzles for holding the electronic parts respectively; an electronic-parts mounting portion for enabling the mounting head to mount the electronic parts on a circuit board; first means for rotating each of the nozzles; and second means for moving each of the nozzles upward and downward.

A second aspect of this invention is based on the first aspect thereof, and provides an electronic-parts mounting apparatus wherein the first means includes a pinion provided on an outer circumferential surface of each of the nozzles, and a rack meshing with the pinion.

A third aspect of this invention is based on the second aspect thereof, and provides an electronic-parts mounting apparatus wherein the rack includes a first rack plate, a second rack plate slidably superposed on the first rack plate, and means for urging the second rack plate relative to the first rack plate in a direction parallel to the first rack plate.

A fourth aspect of this invention is based on the third aspect thereof, and provides an electronic-parts mounting apparatus further comprising third means for urging each of the nozzles in a direction of rotation of the nozzle.

A fifth aspect of this invention is based on the second aspect thereof, and provides an electronic-parts mounting apparatus wherein positions of the nozzles correspond to integer multiples of a pitch of teeth of the rack respectively.

A sixth aspect of this invention is based on the first aspect thereof, and provides an electronic-parts mounting apparatus wherein each of the nozzles includes an outer cylinder, a holder, means for rotatably supporting the outer cylinder on the holder, an inner cylinder extending into the outer cylinder and being movable upward and downward relative to the outer cylinder, a pinion provided on the outer cylinder, and further comprising a rack meshing with the pinion, and means for supporting the rack slidably on the holder.

A seventh aspect of this invention is based on the sixth aspect thereof, and provides an electronic-parts mounting apparatus wherein each of the nozzles includes a coil spring provided between the outer cylinder and the holder.

An eighth aspect of this invention is based on the first aspect thereof, and provides an electronic-parts mounting apparatus wherein the second means includes a fluid-operated actuator having a piston in engagement with an upper end of each of the nozzles.

A ninth aspect of this invention is based on the eighth aspect thereof, and provides an electronic-parts mounting apparatus further comprising a limiting plate engageable with a lower end of the piston for determining a lower limit position of the piston, a first spring for urging the piston downward, and a second spring for urging the nozzle upward.

A tenth aspect of this invention provides an electronic-parts mounting apparatus comprising an electronic-parts feeder; a mounting head for carrying electronic parts from the electronic-parts feeder, the mounting head including a plurality of nozzles for holding the electronic parts respectively; an electronic-parts mounting portion for enabling the mounting head to mount the electronic parts on a circuit board; first means for rotating each of the nozzles; a fluid-operated actuator for moving each of the nozzles upward and downward, the fluid-operated actuator having a piston in engagement with an upper end of each of the nozzles; a limiting plate engageable with a lower end of the piston for determining a lower limit position of the piston; a first spring for urging the piston downward; a second spring for urging the nozzle upward; and second means for moving the limiting plate upward and downward.

An eleventh aspect of this invention provides an electronic-parts mounting apparatus comprising an electronic-parts feeder; a mounting head for carrying electronic parts from the electronic-parts feeder, the mounting head including a plurality of nozzles for holding the electronic parts respectively; an electronic-parts mounting portion for enabling the mounting head to mount the electronic parts on circuit board; first means for rotating each of the nozzles; a fluid-operated actuator for moving each of the nozzles upward and downward, the fluid-operated actuator having a piston in engagement with an upper end of each of the nozzles, a limiting plate engageable with a lower end of the piston for determining a lower limit position of the piston; a first spring for urging the piston downward; a second spring for urging the nozzle upward; second means for detecting heights of the electronic parts held by the nozzles; and third means for moving the limiting plate upward and downward in response to the heights detected by the second means.

A twelfth aspect of this invention is based on the eighth aspect thereof, and provides an electronic-parts mounting apparatus wherein the second means includes a bearing for rotatably connecting the piston and the upper end of each of the nozzles.

DESCRIPTION OF THE PREFERRED EMBODIMENTS

First Embodiment

Figure 1:
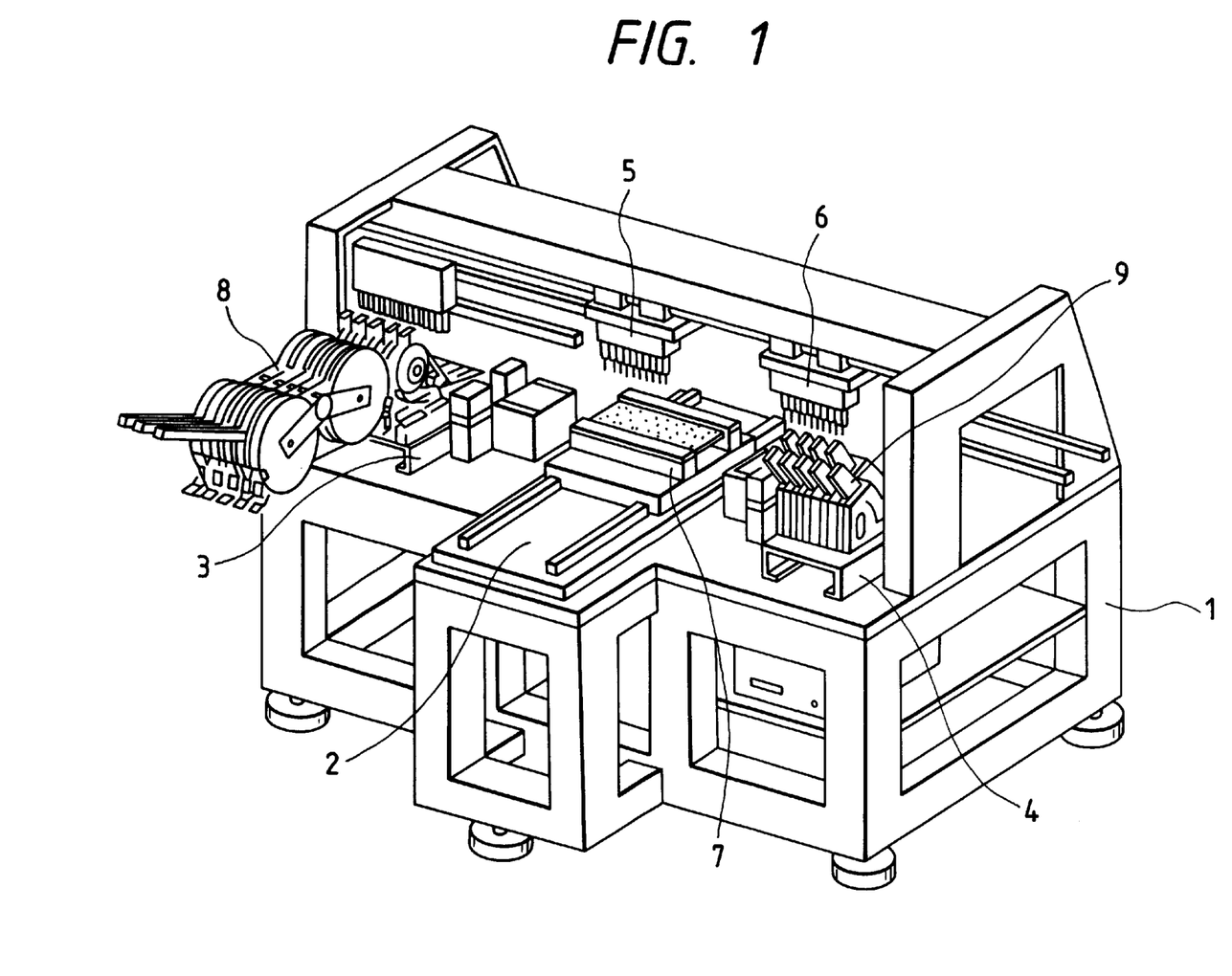
FIG. 1 is a perspective view of an electronic-parts mounting apparatus according to. first embodiment of this invention.
Figure 2:
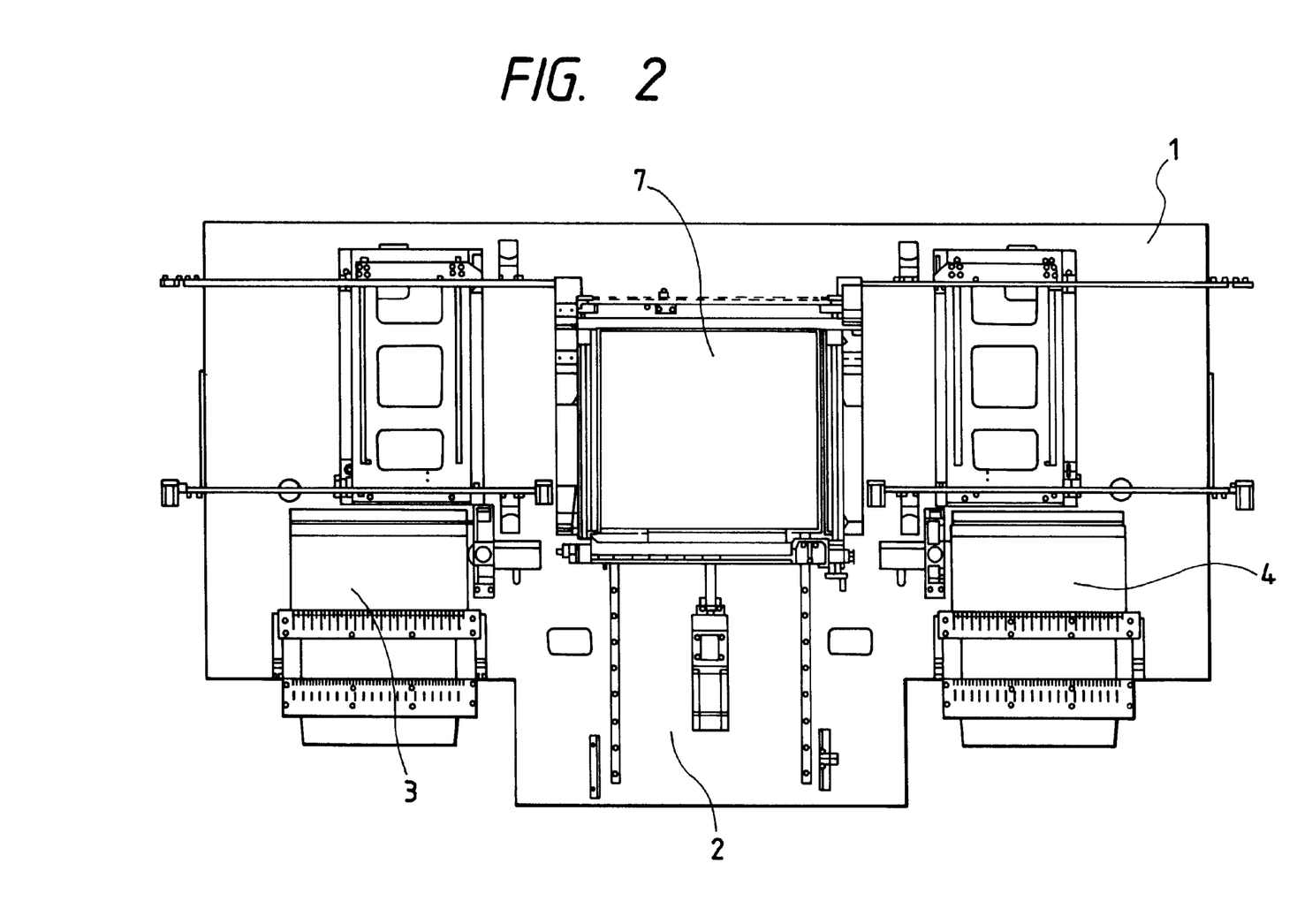
FIG. 2 is a top view of the electronic-parts mounting apparatus in FIG. 1.
Figure 3:
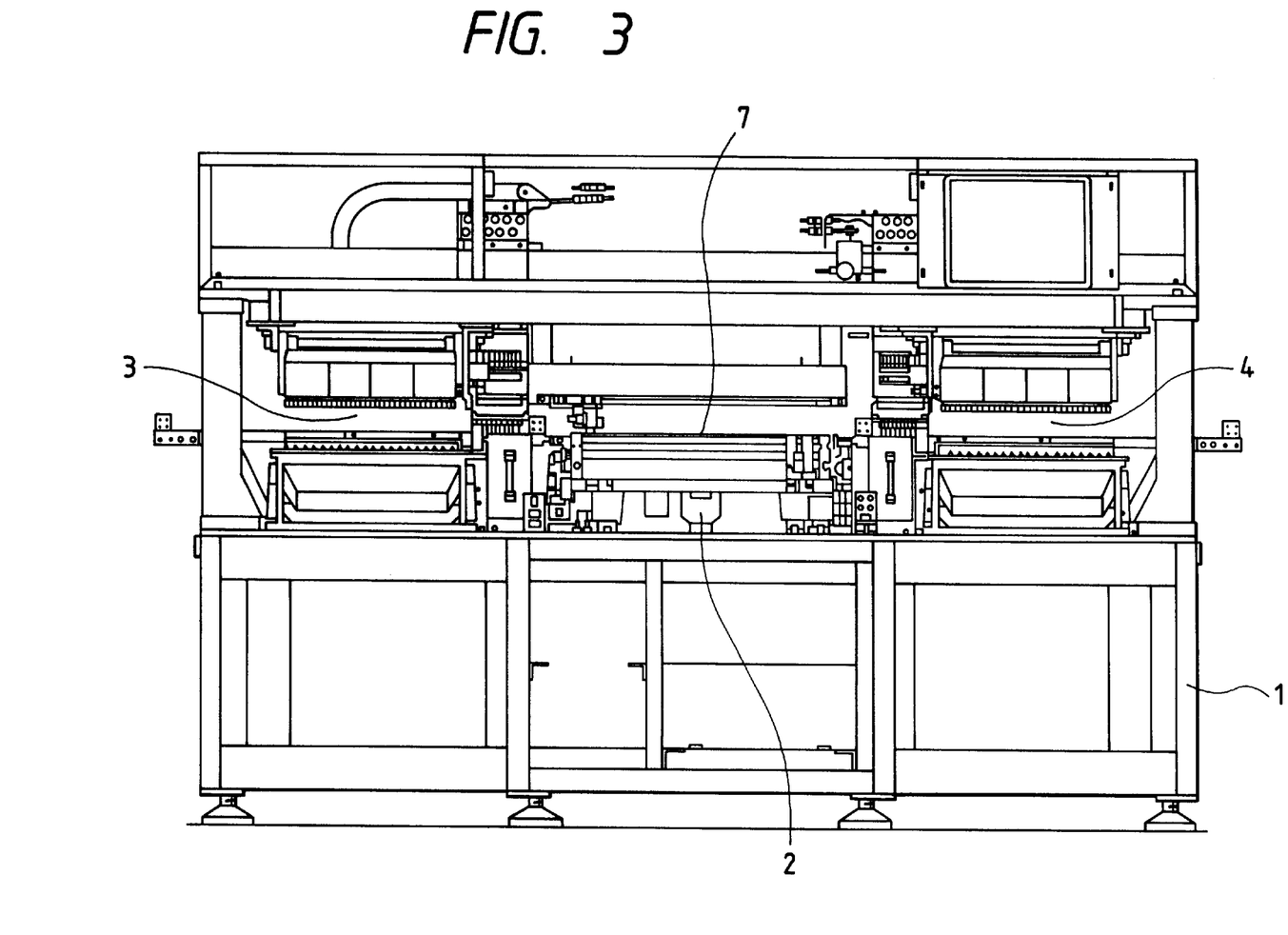
FIG. 3 is a front view of the electronic-parts mounting apparatus in FIG. 1.

With reference to FIGS. 1, 2, and 3, an electronic-parts mounting apparatus in a first embodiment of this invention includes a main body 1 being a metal frame. An electronic-parts mounting portion 2 is provided on a central part of the main body 1. Electronic-parts feeders 3 and 4 are supported on the main body 1. The electronic-parts feeders 3 and 4 extend at the left and the right of the electronic-parts mounting portion 2 respectively.

Mounting heads 5 and 6 are movably supported on the main body 1. The mounting head 5 serves to carry electronic components (electronic parts) from the electronic-parts feeder 3 to the electronic-parts mounting portion 2. The mounting head 6 serves to carry electronic components (electronic parts) from the electronic-parts feeder 4 to the electronic-parts mounting portion 2. The electronic-parts mounting portion 2 is provided with a Y table 7. The Y table 7 can move relative to the main body 1 in a horizontal direction, that is, a Y direction. A printed circuit board is placed on the Y table 7.

The electronic-parts feeder 3 includes taping reels 8 from which electronic components (electronic parts) are fed to the mounting head 5. The electronic-parts feeder 4 includes cassettes 9 from which electronic components (electronic parts) are fed to the mounting head 6.

Figure 4:
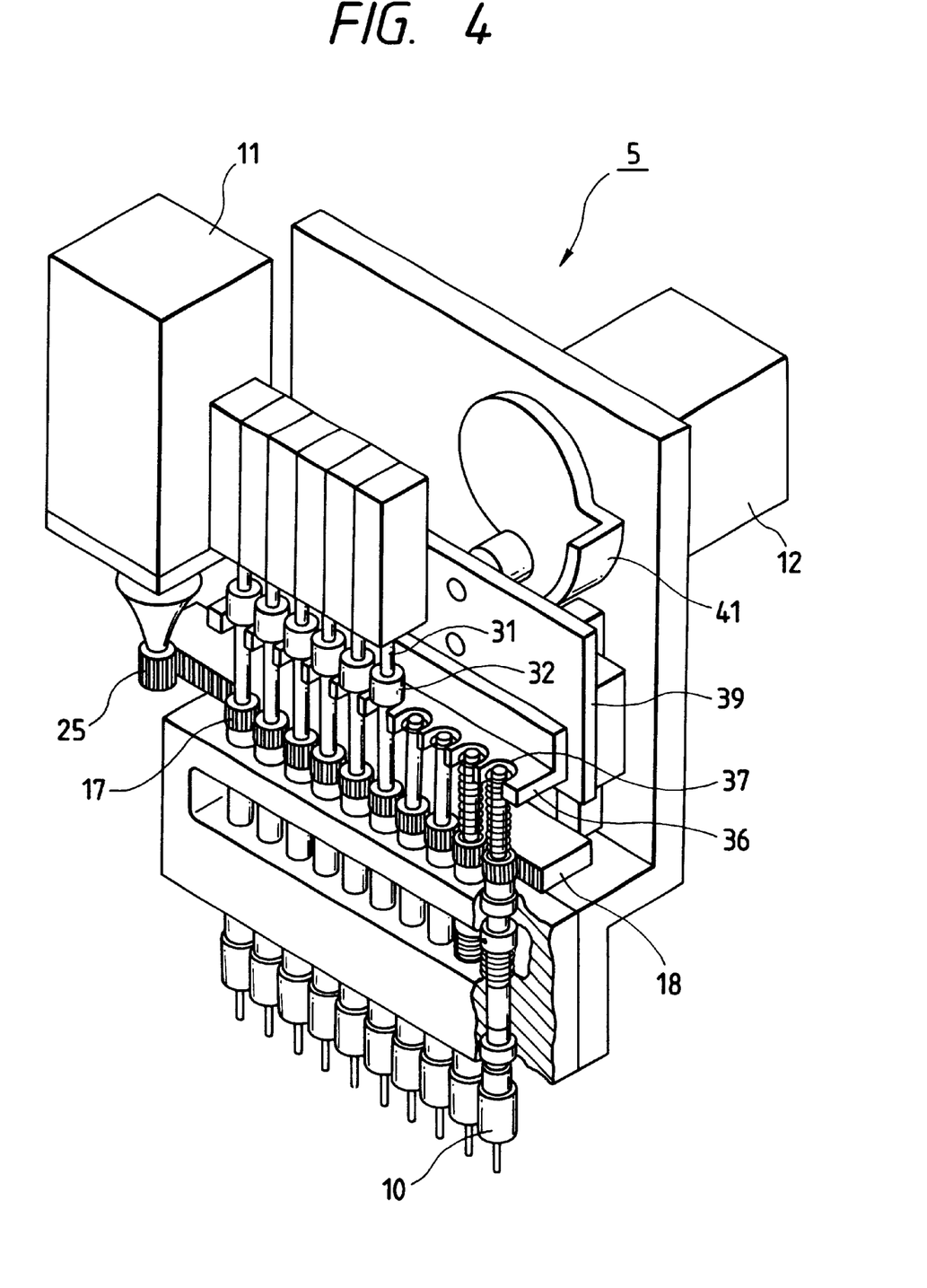
FIG. 4 is a perspective view of a mounting head in FIG. 1 with a portion broken away for the sake of clarity.
Figure 5:
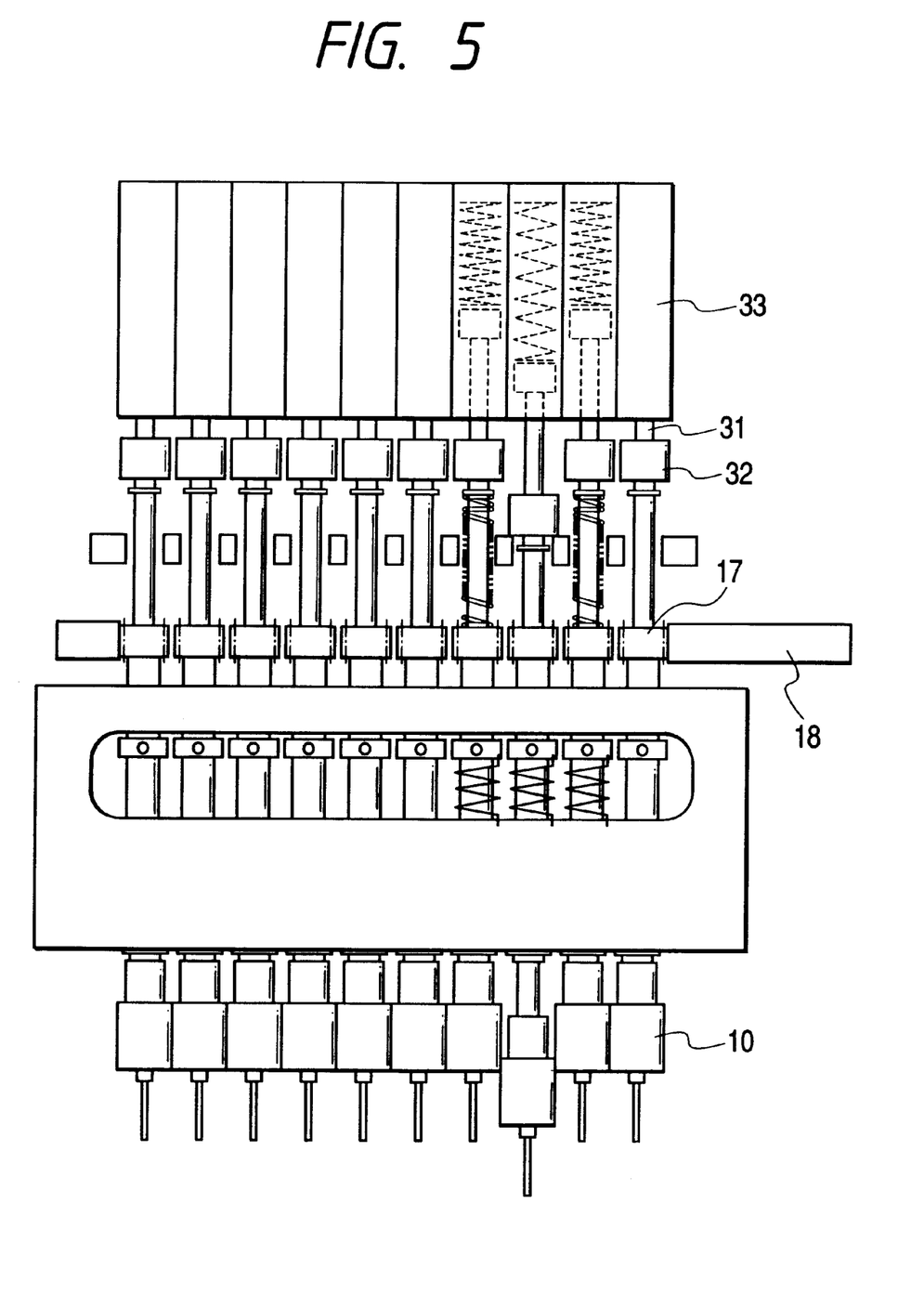
FIG. 5 is a front view of the mounting head in FIG. 4.

The mounting heads 5 and 6 have similar structures. Therefore, only the mounting head 5 will be explained in detail. As shown in FIGS. 4 and 5, the mounting head 5 includes ten sucking nozzles 10 arranged in a line. Also, the mounting head 5 includes a motor 11 for circumferentially rotating the sucking nozzles 10. Furthermore, the mounting head 5 includes a motor 12 for controlling the lower limit of vertical displacements of the sucking nozzles 10.

Figure 6:
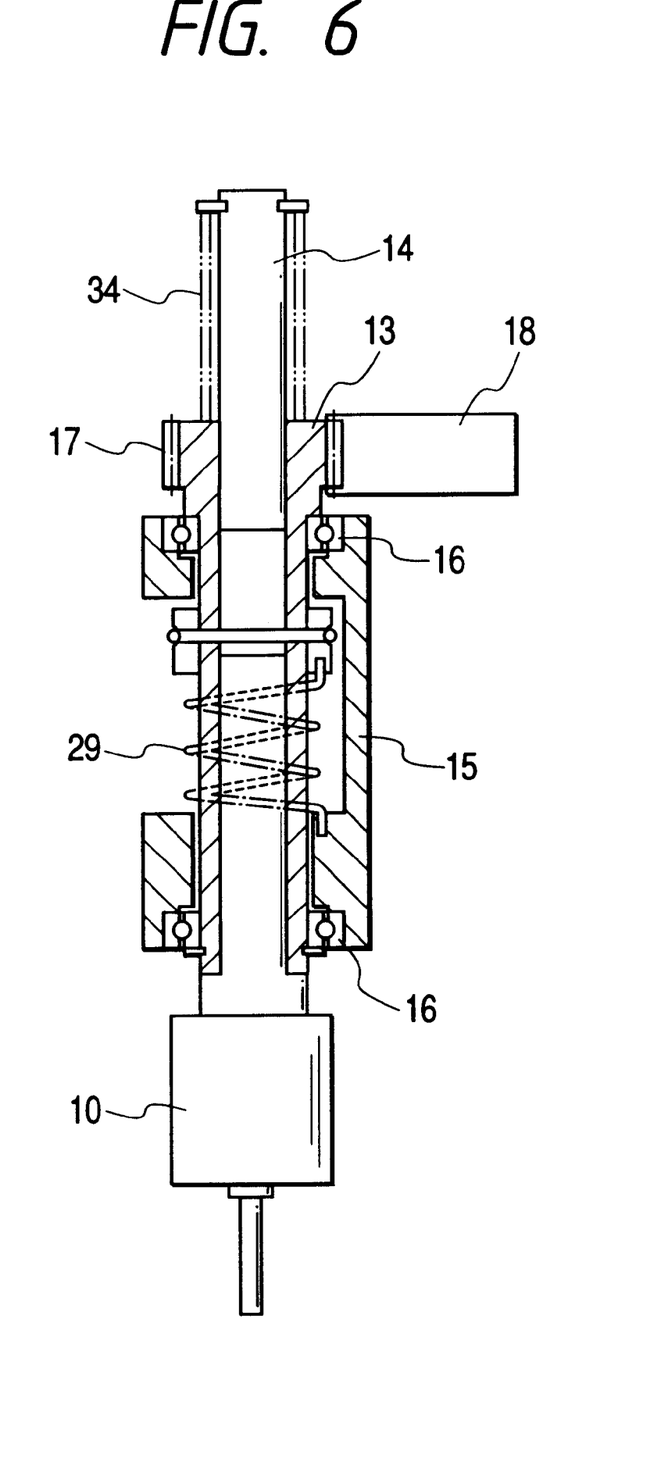
FIG. 6 is a sectional view of a sucking nozzle in FIGS. 4 and 5.

As shown in FIG. 6, each sucking nozzle 10 includes an outer cylinder (an outer sleeve) 13 and an inner cylinder (an inner sleeve) 14. The inner cylinder 14 coaxially extends into the outer cylinder 13 via an upper end thereof. The outer cylinder 13 and the inner cylinder 14 are connected via a suitable coupling such as a pin-slit coupling or a key coupling which allows the inner cylinder 14 to circumferentially rotate together with the outer cylinder 13, and to axially slide relative to the outer cylinder 13. The outer cylinder 13 is rotatably supported on a holder 15 by upper and lower bearings 16. The outer cylinder 13 is allowed to rotate in a circumferential direction. An upper end of the outer cylinder 13 is formed with a pinion 17. The pinion 17 meshes with a rack 18. The rack 18 is slidably supported by the holder 15.

Figure 7:
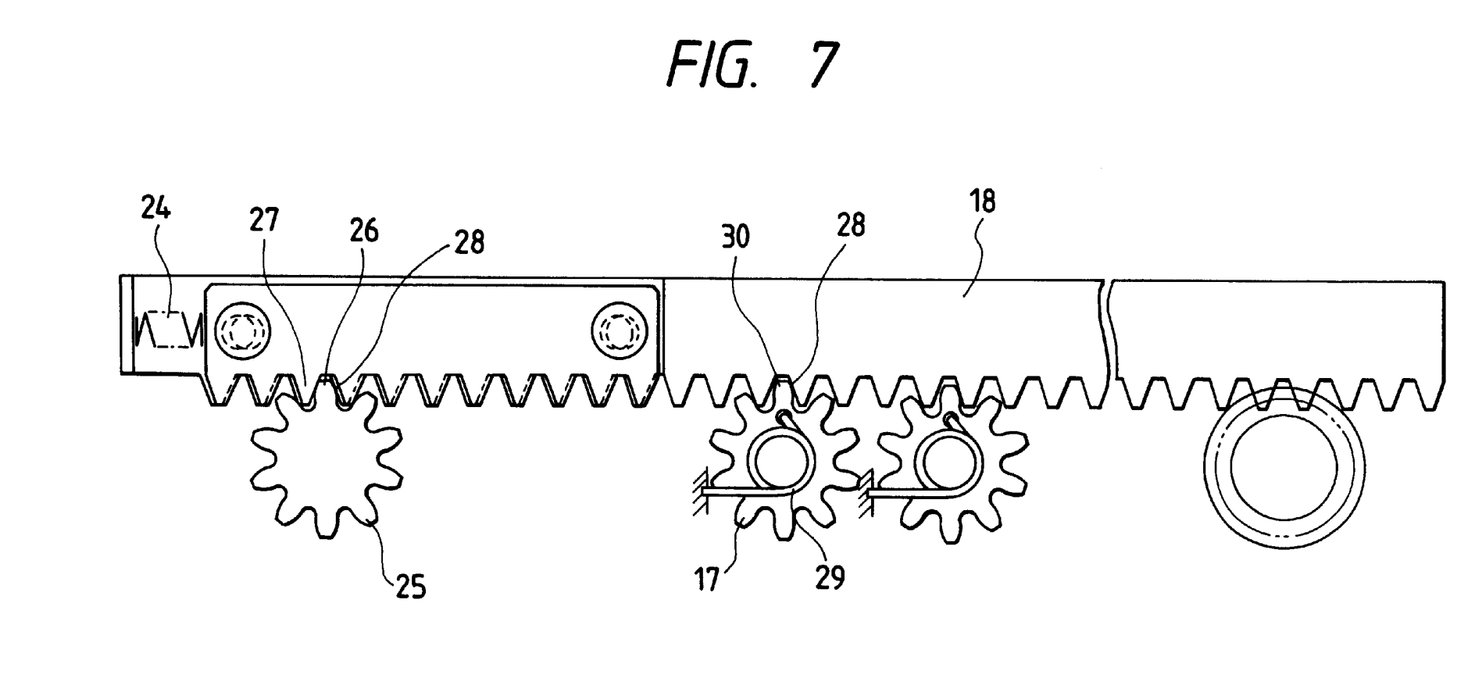
FIG. 7 is a plan view of a rack and pinions in FIG. 4.
Figure 8:
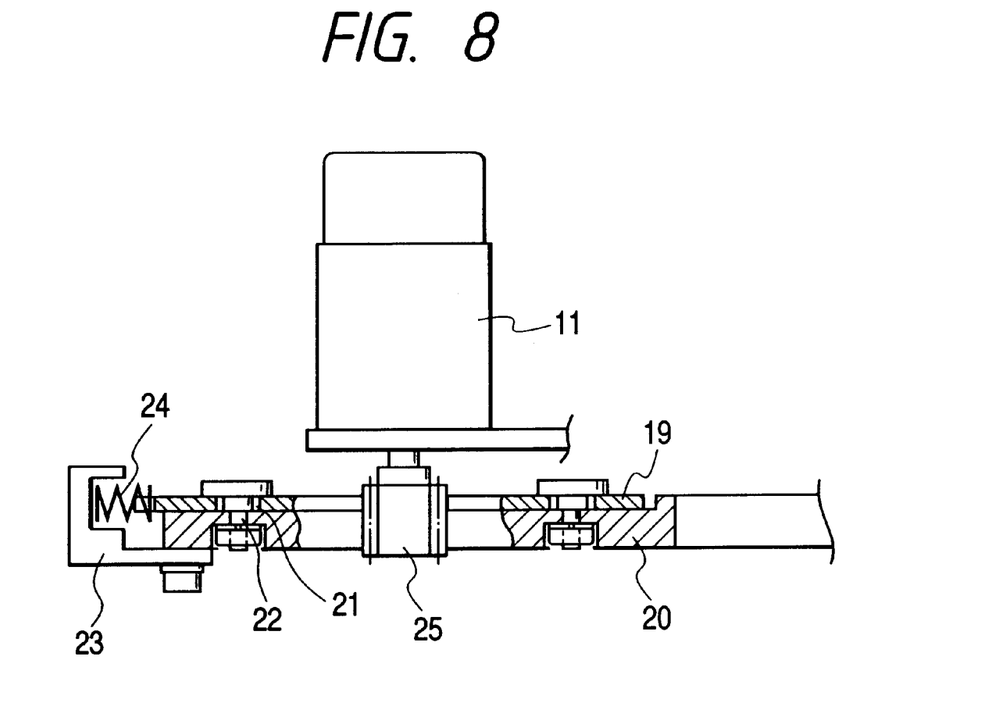
FIG. 8 is a sectional view of the rack in FIG. 7.
Figure 9:
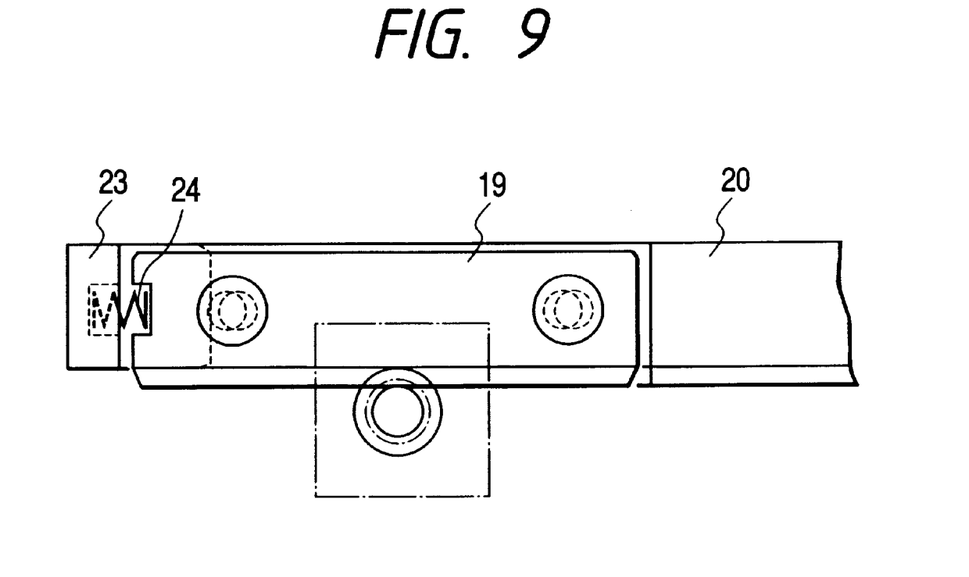
FIG. 9 is a top view of the rack in FIG. 7.

As shown in FIGS. 7, 8, and 9, the rack 18 includes upper and lower plates 19 and 20 both formed with teeth. The upper plate 19 is superposed on the lower plate 20. The lower plate 20 can move relative to the holder 15 in a horizontal direction. The upper plate 19 is thinner than the lower plate 20. The upper plate 19 can slide horizontally relative to the lower plate 20.

As best shown in FIGS. 7 and 8, the upper plate 19 has holes 21 through which pins 22 extend respectively. The pins 22 are fixed to the lower plate 20. The inside dimensions of the holes 21 are set greater than the outside dimensions of the pins 22 to allow leftward and rightward horizontal slide of the upper plate 19 relative to the lower plate 20.

As best shown in FIG. 8, an arm 23 is fixed to one end of the lower plate 19. One end of a spring 24 engages the arm 23 while the other end of the spring 24 abuts against one end of the upper plate 19. The spring 24 urges the upper plate 19 rightward as viewed in FIGS. 7, 8, and 9.

As shown in FIGS. 4, 7, and 8, a pinion 25 meshes with the teeth of the upper plate 19 and also the teeth of the lower plate 20. As best shown in FIG. 7, the spring 24 presses a tooth 27 of the upper plate 19 against the left side of a tooth 26 of the pinion 25, thereby pressing the right side of the tooth 26 of the pinion 25 against a tooth 28 of the lower plate 20. Therefore, the tooth 26 of the pinion 25 is firmly held between the tooth 27 of the upper plate 19 and the tooth 28 of the lower plate 20. Thus, the mesh between the rack 18 (including the upper plate 19 and the lower plate 20) and the pinion 25 is free from backlash.

The pinion 25 is mounted on an output shaft of the motor 11. The pinion 25 rotates in accordance with rotation of the output shaft of the motor 11. As previously indicated, the pinion 25 meshes with the rack 18. The rack 18 moves rightward and leftward in accordance with rotation of the pinion 25. Accordingly, the rack 18 is moved horizontally by the motor 11.

With reference back to FIG. 6, a helical spring (a coil spring) 29 extends around the outer cylinder 13 of the sucking nozzle 10. One end of the spring 29 is fixed to the holder 15 while the other end thereof is attached to the outer cylinder 13. As previously indicated, the outer cylinder 13 is formed with the pinion 17 which meshes with the rack 18. As shown in FIGS. 6 and 7, the spring 29 urges the outer cylinder 13 circumferentially relative to the holder 15 so that a side of a tooth 30 of the pinion 17 is pressed against a tooth 28 of the rack 18. Thus, the mesh between the rack 18 and the pinion 17 is free from backlash.

The pinion 17 rotates as the rack 18 moves horizontally. Accordingly, the outer cylinder 13 rotates in accordance with horizontal movement of the rack 18. Since the rack 18 can be moved horizontally by the motor 1, the outer cylinder 13 can be rotated by the motor 11. A working portion (a lower portion) of the sucking nozzle 10 is connected by a suitable coupling such as a pin-slit coupling or a key coupling to the outer cylinder 13 so that the working portion of the sucking nozzle 10 will rotate circumferentially together with the outer cylinder 13 while being able to move vertically relative to the outer cylinder 13. The working portion of the sucking nozzle 10 operates to suck and hold an electronic component. The electronic component held by the working portion of the sucking nozzle 10 can be rotated by the motor 11.

The ten sucking nozzles 10 are arranged at equal intervals chosen so that the pinions 17 on the sucking nozzles 10 will be equal to each other in teeth phase (angular teeth position) with respect to the teeth of the rack 18. For example, the positions of the sucking nozzles 10 correspond to integer multiples of the pitch of the teeth of the rack 18 respectively. Thus, the angular positions of the ten sucking nozzles 10 are equal to each other. The angular positions of the sucking nozzles 10 vary equally (or in synchronization) in accordance with horizontal movement of the rack 18, that is, in accordance with rotation of the pinion 25.

As shown in FIG. 6, the inner cylinder 14 extends into the outer cylinder 13 via an upper end of the outer cylinder 13. The inner cylinder 14 can slide axially relative to the outer cylinder 13. In other words, the inner cylinder 14 can move upward and downward relative to the outer cylinder 13. The working portion (the lower portion) of the sucking nozzle 10 is connected to or integral with the inner cylinder 14 so that the working portion of the sucking nozzle 10 can move and rotate together with the inner cylinder 14.

Figure 10:
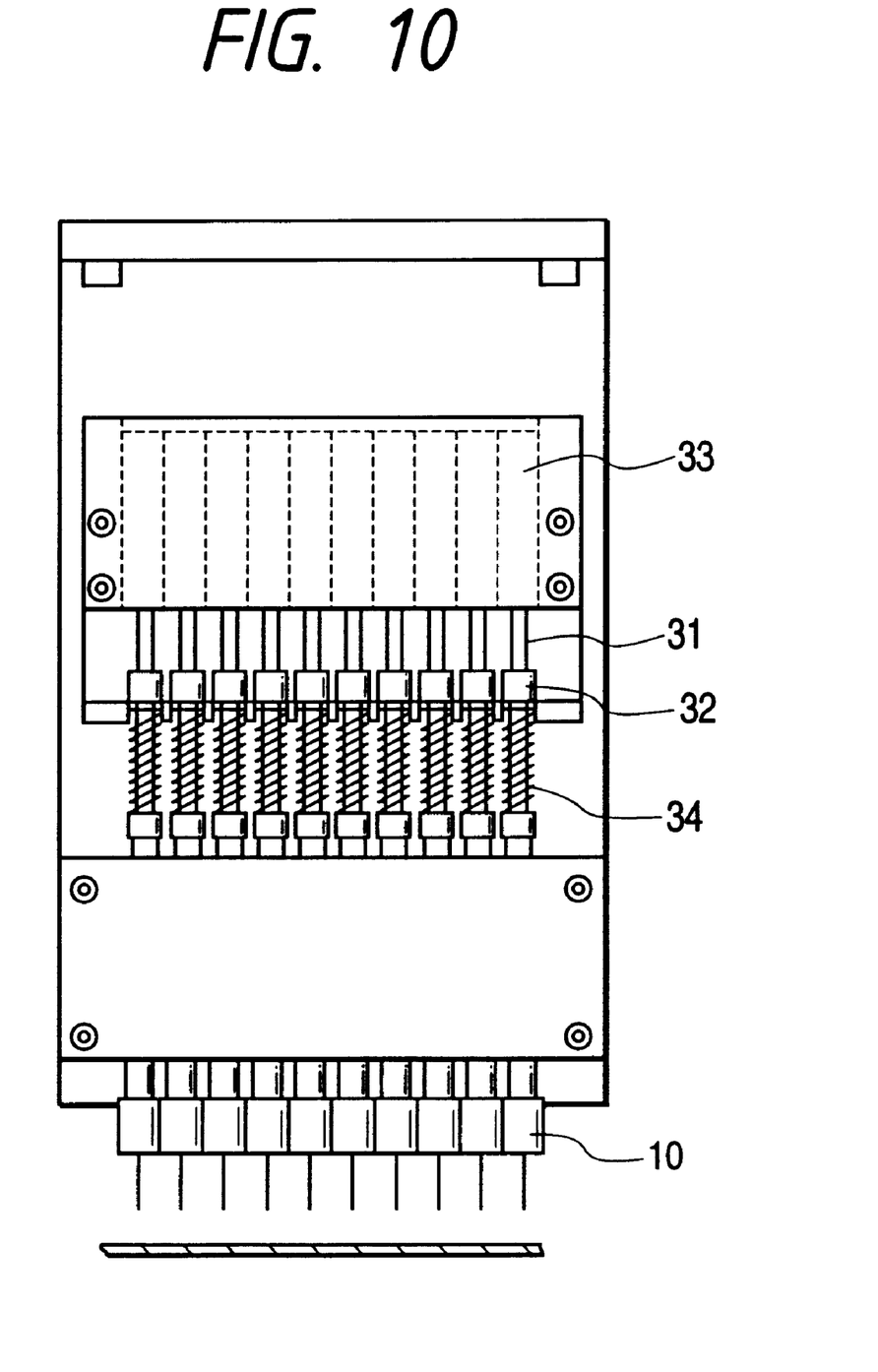
FIG. 10 is a front view of the mounting head in FIG. 4.
Figure 11:
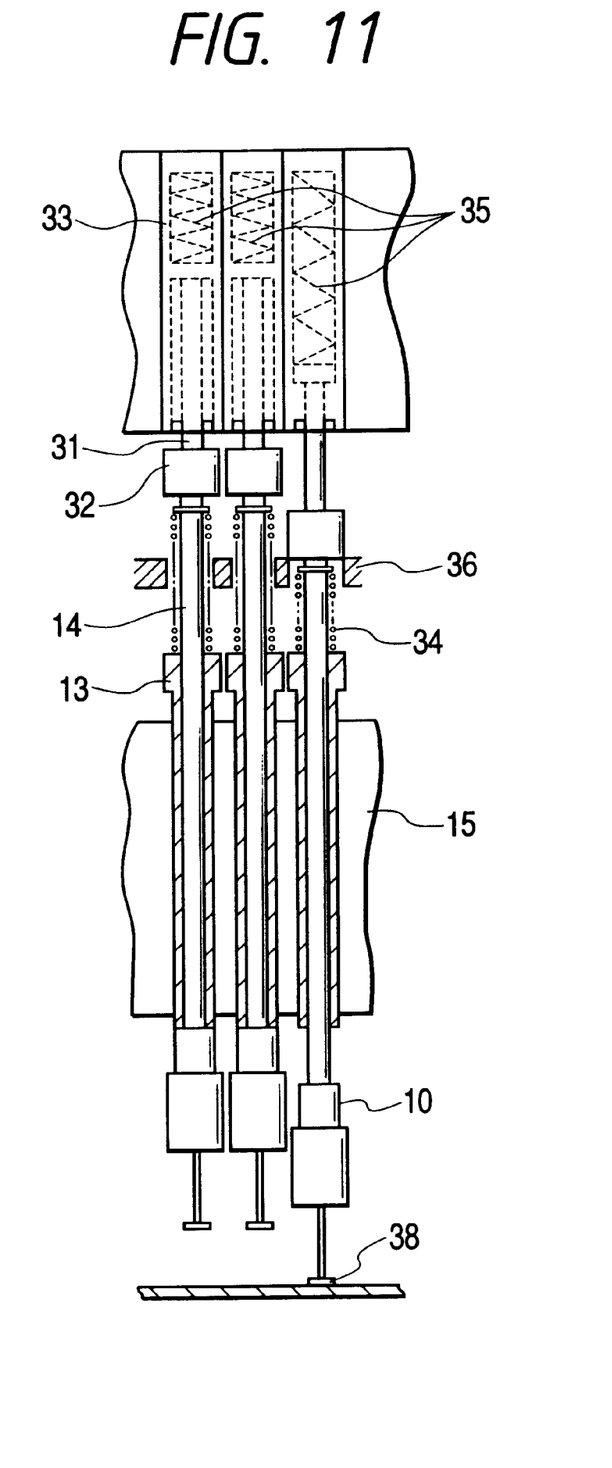
FIG. 11 is a sectional view of the mounting head in FIG. 10.

One of the ten sucking nozzles 10 will be further explained. As shown in FIGS. 10 and 11, an upper end of the inner cylinder 14 contacts a large-diameter lower end 32 of an actuator piston 31. The actuator piston 31 slidably extends into an actuator cylinder 33. The actuator piston 31 can move axially relative to the actuator cylinder 33. In other words, the actuator piston 31 can move upward and downward relative to the actuator cylinder 33. A spring 34 is provided between an upper end of the outer cylinder 13 and a flange on the inner cylinder 14. The spring 34 urges the inner cylinder 14 upward relative to the outer cylinder 13. A spring 35 disposed in the actuator cylinder 33 extends between an upper wall of the actuator cylinder 33 and an upper end of the actuator piston 31. The spring 35 urges the actuator piston 31 downward relative to the actuator cylinder 33. The springs 34 and 35 bring the upper end of the inner cylinder 14 and the large-diameter lower end 32 of the actuator piston 31 into contact with each other.

Working fluid such as air can be supplied to and drawn from a working chamber within the actuator cylinder 33 which extends above the actuator piston 31. As the working fluid is supplied to the working chamber within the actuator cylinder 33, the actuator piston 31 is moved downward. As the working fluid is drawn from the working chamber within the actuator cylinder 33, the actuator piston 31 is moved upward.

With reference to FIGS. 4 and 11, the large-diameter lower end 32 of the actuator piston 31 can meet a limiting plate 36. The limiting plate 36 has ten semicircular recesses 37 which correspond to the ten sucking nozzles 10 respectively. The inner cylinder 14 movably extends through the corresponding recess 37 in the limiting plate 36. As the working fluid is supplied to the working chamber within the actuator cylinder 33, the actuator piston 31 is moved downward until the large-diameter lower end 32 thereof meets the limiting plate 36. In other words, downward movement of the actuator piston 31 is stopped by the limiting plate 36. Thus, the limiting plate 36 determines the lower limit position of the actuator piston 31. Also, the limiting plate 36 determines the lower limit position of the working portion of the sucking nozzle 10. In the case where the large-diameter lower end 32 of the actuator piston 31 reaches the limiting plate 36, the piston 32 remains in its lower limit position even if the working fluid is further supplied to the working chamber within the actuator cylinder 33. As will be made clear later, the lower limit position of the piston 32 is variable or movable.

Figure 12:
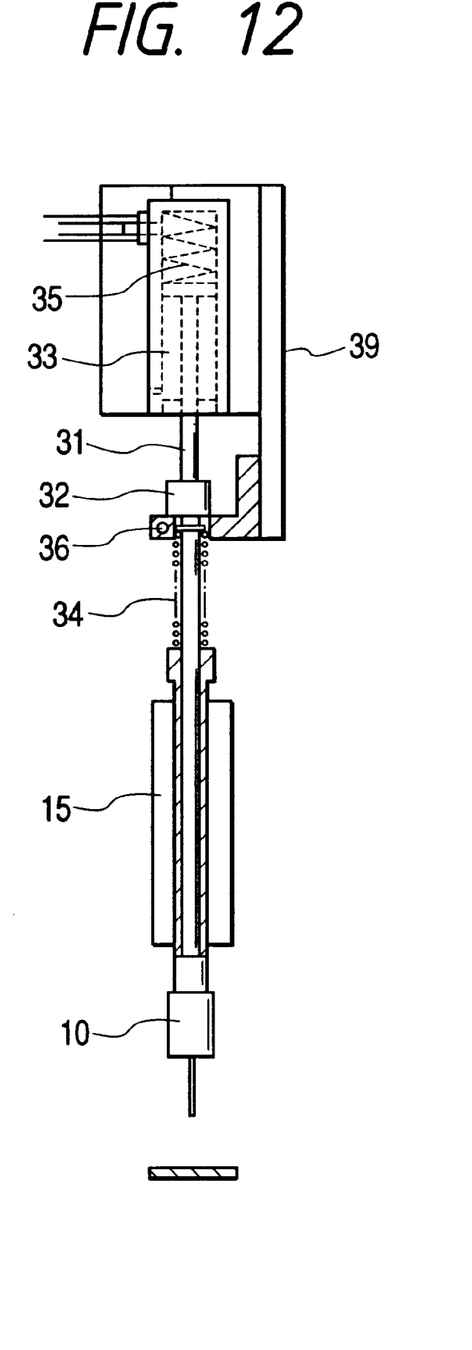
FIG. 12 is a sectional view of the mounting head in FIG. 10 in which a nozzle assumes a higher position.
Figure 13:
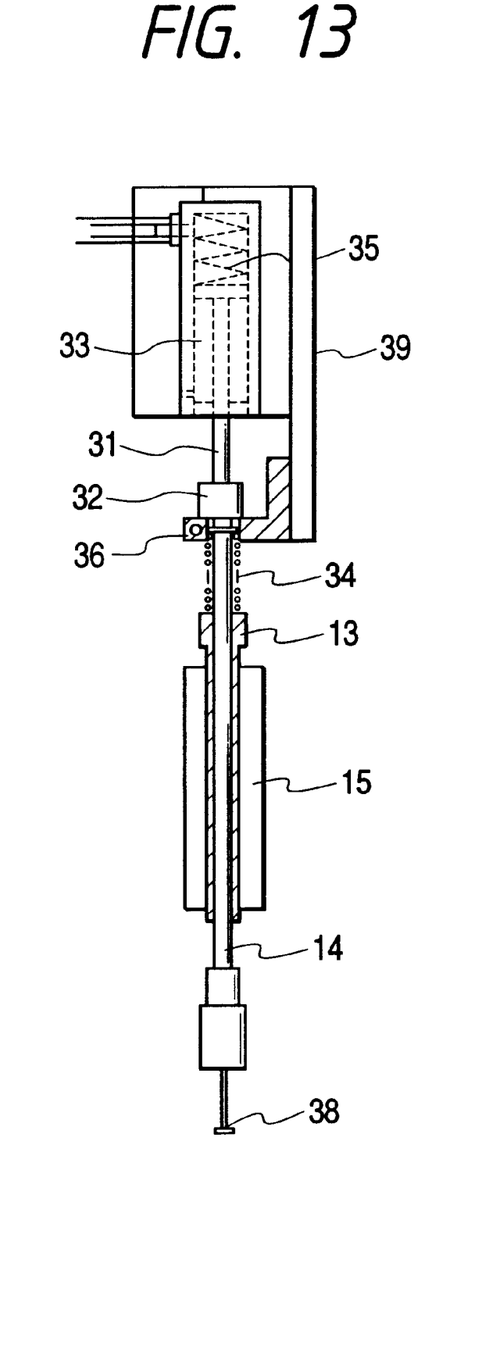
FIG. 13 is a sectional view of the mounting head in FIG. 10 in which the nozzle assumes a lower position.

The limiting plate 36 can move upward and downward. In the case where the working fluid is supplied to the working chamber within the actuator cylinder 33 so that the large-diameter lower end 32 of the actuator piston 31 is in contact with the limiting plate 36, as the limiting plate 36 moves upward and downward, the actuator piston 31 and the inner cylinder 14 move upward and downward while the large-diameter lower end 32 of the actuator piston 31 remains in contact with the limiting plate 36 and also the upper end of the inner cylinder 14 (see FIGS. 12 and 13). Thus, in this case, the inner cylinder 14 moves upward and downward in accordance with the movement of the limiting plate 36. The working portion of the sucking nozzle 10 is connected to the inner cylinder 14 so as to move upward and downward in accordance with the movement of the inner cylinder 14. The downward movement of the working portion of the sucking nozzle 10 is used in access to an electronic component 38 as follows. After the working portion of the sucking nozzle 10 reaches the electronic component 38 according to the downward movement thereof, a lower end of the sucking nozzle 10 sucks and picks up the electronic component 38. Then, the working portion of the sucking nozzle 10 moves upward while holding the electronic component 38 (see FIGS. 12 and 13). During the downward movement of the working portion of the sucking nozzle 10 in accordance with the downward movement of the limiting plate 36, the large-diameter lower end 32 of the actuator piston 31 remains in contact with the limiting plate 36 and also the upper end of the inner cylinder 14 so that unwanted vibration or unwanted sound is prevented from occurring.

Figure 14:
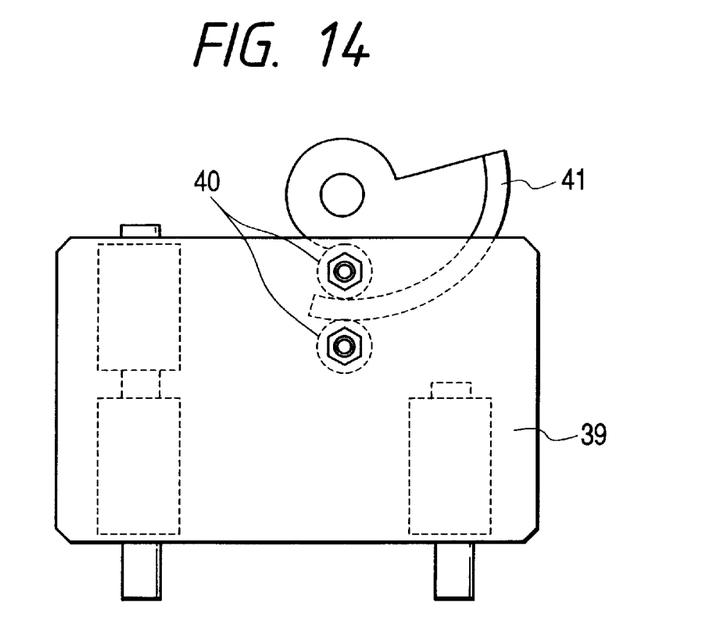
FIG. 14 is a front view of a cam and an intermediate plate in the mounting head in FIG. 4 where the cam assumes a first limit position.
Figure 15:
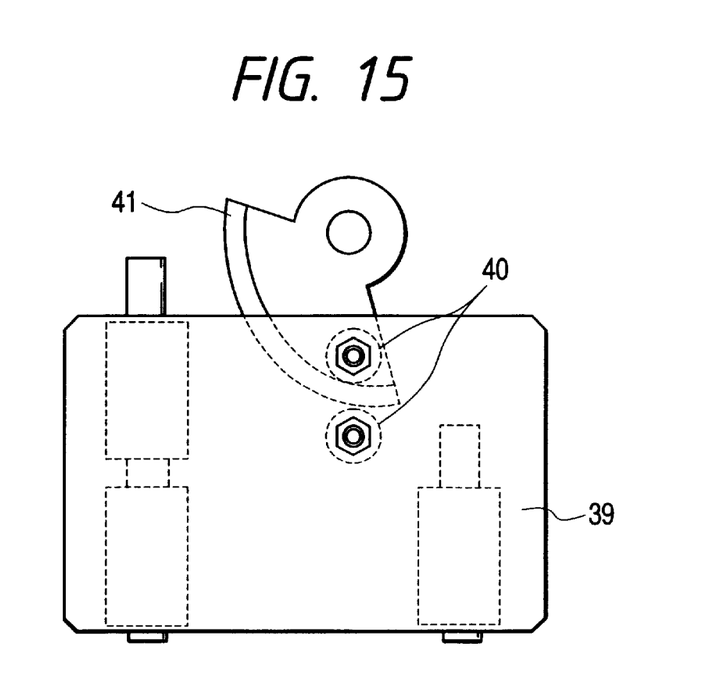
FIG. 15 is a front view of the cam and the intermediate plate in the mounting head in FIG. 4 where the cam assumes a second limit position.

As shown in FIGS. 4, 14, and 15, the limiting plate 36 is fixed to an intermediate plate 39 on which two rollers 40 are rotatably mounted. The two rollers 40 are vertically spaced from each other by a predetermined interval. An effective portion of a rotatable cam 41 is sandwiched between the rollers 40. The cam 41 is connected to an output shaft of the motor 12 so that the cam 41 can be rotated by the motor 12. The cam 41 is designed so that rotation of the cam 41 will move the intermediate plate 39 upward and downward. The limiting plate 36 moves upward and downward together with the intermediate plate 39. Thus, the limiting plate 36 is moved upward and downward by the motor 12.

The operation of the mounting head 6 will be further explained. The mounting head 6 is placed above the electronic-parts feeder 4. In the mounting head 6, the limiting plate 36 is moved downward by the motor 12. The working portion (the lower portion) of the sucking nozzle 10 is moved downward to access an electronic component 38 in the corresponding cassette 9 of the electronic-parts feeder 4 in accordance with the movement of the limiting plate 36. Then, the lower end of the sucking nozzle 10 sucks an electronic component 38 from the corresponding cassette 9 (see FIGS. 11 and 13). Subsequently, the cam 41 is rotated by the motor 12 from the position shown in FIG. 15 to the position shown in FIG. 14 so that the working portion of the sucking nozzle 10 moves upward while the lower end of the sucking nozzle 10 continues to hold the electronic component 38. In this way, the sucking nozzle 10 picks up the electronic component 38. Then, the mounting head 6 is moved (leftward as viewed in FIG. 1) by a suitable drive mechanism to the electronic-parts mounting portion 2 along a carry path.

Figure 16:
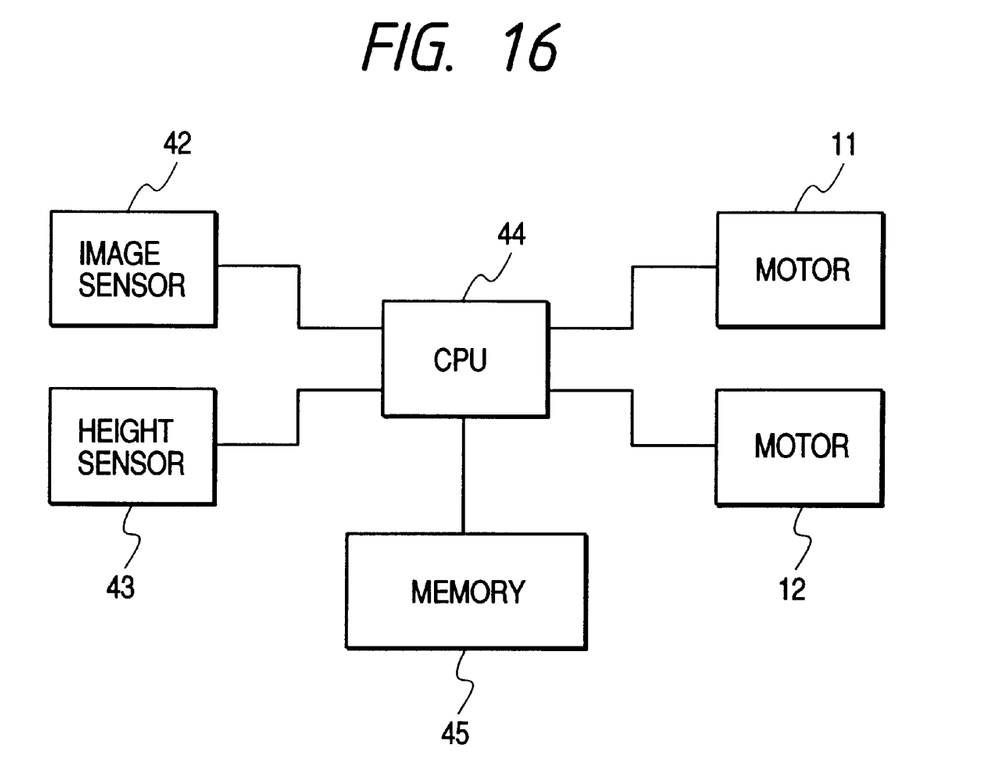
FIG. 16 is a block diagram of an electric portion of the electronic-parts mounting apparatus in FIG. 1.

When the mounting head 6 is moved along the carry path, an image sensor or a camera 42 located below the carry path takes an image of the electronic component 38 held by the sucking nozzle 10. As shown in FIG. 16, the image sensor 42 is electrically connected to a controller 44 including a CPU (central processing unit). When the mounting head 6 is moved along the carry path, a height sensor 43 located near the carry path detects the height of the electronic component 38 held by the sucking nozzle 10. As shown in FIG. 16, the height sensor 43 is electrically connected to the controller 44. In addition, the motors 11 and 12 are electrically connected to the controller 44. Furthermore, a memory 45 is electrically connected to the controller 44. The memory 45 stores data representing a desired posture of an electronic component held by each sucking nozzle 10. The desired posture of the electronic component includes a desired tilt or inclination of the electronic component, and a desired angle thereof. The controller 44 drives the motors 11 and 12 in response to output signals of the image sensor 42 and the height sensor 43 and output data from the memory 45 according to a program stored in a ROM within the CPU. The program is designed to implement the following processes.

The controller 44 calculates the actual posture of the electronic component 38 held by the sucking nozzle 10 in response to the output signal of the image sensor 42. The controller 44 collates the calculated actual posture with the desired posture represented by the output data from the memory 45, and thereby calculates a postural error of the electronic component 38 held by the sucking nozzle 10. The calculated postural error includes a calculated angular error. The controller 44 drives the motor 11 in response to the calculated angular error of the electronic component 38 held by the sucking nozzle 10. As the motor 11 is driven, the outer cylinder 13 is rotated and hence the electronic component 38 held by the sucking nozzle 10 is also rotated. The rotation of the electronic component 38 corrects the angular error thereof. Accordingly, the actual posture of the electronic component 38 held by the sucking nozzle 10 is corrected into agreement with the desired posture thereof.

The mounting head 6 carries electronic components to the electronic-parts mounting portion 2, and then mounts them on a printed circuit board placed on the Y table 7. Since angular errors of the electronic components are corrected as indicated above, they can be accurately mounted on the printed circuit board.

When the mounting head 6 carries the electronic component 38 toward the electronic-parts mounting portion 2, the controller 44 derives the height of the electronic component 38 held by the sucking nozzle 10 from the output signal of the height sensor 43. The controller 44 drives the motor 12 in response to the derived height of the electronic component 38. As the motor 12 is driven, the limiting plate 36 is moved vertically. The vertical movement of the limiting plate 36 is designed so as to prevent the sucking nozzle 10 from excessively pressing the electronic component 38 against the printed circuit board during the electronic-parts mounting process. It should be noted that the limiting plate 36 determines the lower limit position of the working portion of the sucking nozzle 10.

The memory 45 may store data representing the height of electronic components. The controller 44 may drive the motor 12 in response to the height data fed from the memory 45.

Second Embodiment

Figure 17:
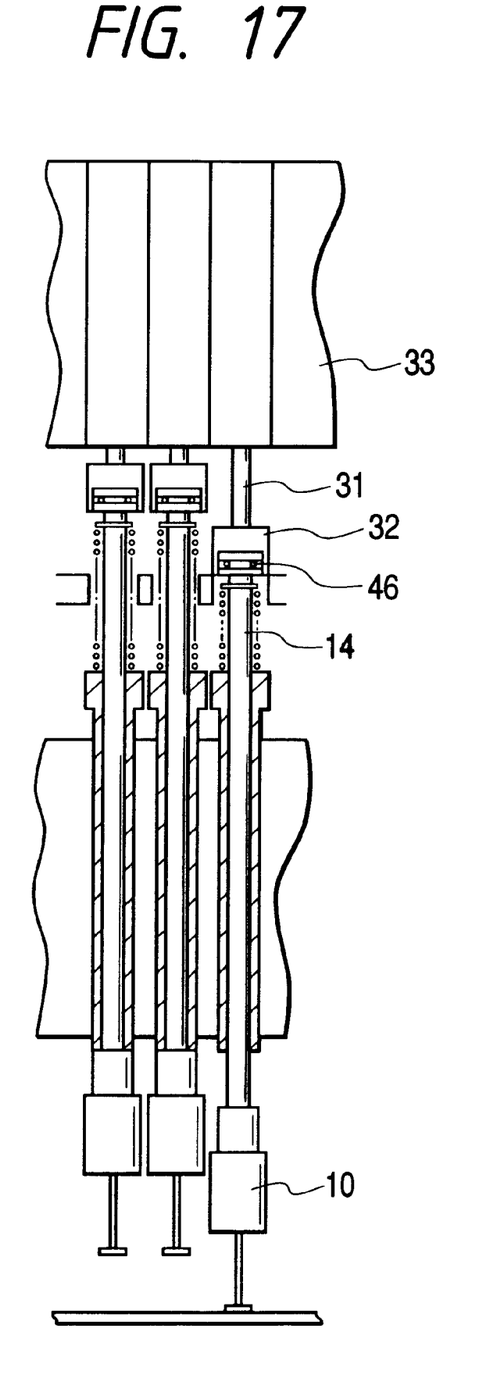
FIG. 17 is a sectional view of a portion of a mounting head in an electronic-parts mounting apparatus according to second embodiment of this invention.

FIG. 17 shows a second embodiment of this invention which is similar to the first embodiment thereof except for the following design change. A large-diameter lower end 32 of each actuator piston 31 is provided with a bearing 46 via which an upper end of an inner cylinder 14 is associated or connected with the actuator piston 31. The bearing 46 allows circumferential rotation of the inner cylinder 14 relative to the actuator piston 31. Therefore, when the inner cylinder 14 rotates, the bearing 46 prevents rotation of the actuator piston 31 which might damage a combination of the actuator piston 31 and an actuator cylinder 33.

What is claimed is:

1. An electronic-parts mounting apparatus comprising:
   an electronic-parts feeder;
   a mounting head for carrying electronic parts from the electronic-parts feeder, the mounting head including a plurality of nozzles for respectively holding the electronic parts;
   an electronic-parts mounting portion for enabling the plurality of nozzles of the mounting head to mount the electronic parts on a circuit board;
   first means for effecting movement to rotate said nozzles about axes of said nozzles respectively and thereby rotate the respective angular positions of said nozzles equally; and
   second means for moving each of the nozzles upward and downward;
   wherein the first means includes a pinion provided on an outer circumferential surface of each of the nozzles, and a rack meshing with the pinion.

2. The electronic-parts mounting apparatus as recited in claim 1, wherein the rack includes a first rack plate, a second rack plate slidably superposed on the first rack plate, and means for urging the second rack plate relative to the first rack plate in a direction parallel to the first rack plate.

3. The electronic-parts mounting apparatus as recited in claim 2, further comprising third means for urging each of the nozzles in a direction of rotation of the nozzle.

4. The electronic-parts mounting apparatus as recited in claim 1, wherein positions of the nozzles correspond to integer multiples of a pitch of teeth of the rack respectively.

5. The electronic-parts mounting apparatus as recited in claim 1, wherein each of the nozzles includes an outer cylinder, a holder, means for rotatably supporting the outer cylinder on the holder, and an inner cylinder extending into the outer cylinder and being movable upward and downward relative to the outer cylinder, and wherein the pinion is provided on the outer cylinder, and further comprising means for supporting the rack sildably on the holder.

6. The electronic-parts mounting apparatus as recited in claim 5, wherein each of the nozzles includes a coil spring provided between the outer cylinder and the holder.

7. The electronic-parts mounting apparatus as recited in claim 1, wherein the second means includes a fluid-operated actuator having a pistion engagement with an upper end of each of the nozzles.

8. The electronic-parts mounting apparatus as recited in claim 7, further comprising a limiting plate engageable with a lower end of the piston for determining a lower limit position of the piston, a first spring for urging the piston downward, and a second spring for urging the nozzle upward.

9. The electronic-parts mounting apparatus as recited in claim 7, wherein the second means includes a bearing for rotatably connecting the piston and the upper end of each of the nozzles.

10. An electronic-parts mounting apparatus comprising:
an electronic-parts feeder;
a mounting head for carrying electronic parts from the electronic-parts feeder, the mounting head including a plurality of nozzles for respectively holding the electronic parts;
an electronic-parts mounting portion for enabling the plurality of nozzles of the mounting head to mount the electronic parts on a circuit board;
first means for effecting movement to rotate the respective angular positions of said nozzles equally;
a fluid-operated actuator for moving each of the nozzles upward and downward, the fluid-operated actuator having a piston in engagement with an upper end of each of the nozzles;
a limiting plate engageable with a lower end of the piston for determining a lower limit position of the piston;
a first spring for urging the piston downward;
a second spring for urging the nozzle upward; and
second means for moving the limiting plate upward and downward.

11. An electronic-parts mounting apparatus comprising:
an electronic-parts feeder;
a mounting head for carrying electronic parts from the electronic-parts feeder, the mounting head including a plurality of nozzles for respectively holding the electronic parts;
an electronic-parts mounting portion for enabling the plurality of nozzles of the mounting head to mount the electronic parts on a circuit board;
first means for effecting movement to rotate the angular respective positions of said nozzles equally;
a fluid-operated actuator for moving each of the nozzles upward and downward, the fluid-operated actuator having a piston in engagement with an upper end of each of the nozzles;
a limiting plate engageable with a lower end of the piston for determining a lower limit position of the piston;
a first spring for urging the piston downward;
a second spring for urging the nozzle upward;
second means for detecting the respective heights of the electronic parts held by the nozzles; and
third means for moving the limiting plate upward and downward in response to the respective heights detected by the second means.

12. An electronic-parts mounting apparatus comprising:
an electronic-parts feeder;
a mounting head movable in a predetermined direction for carrying electronic parts from the electronic-parts feeder, the mounting head including a plurality of nozzles for respectively holding the electronic parts, the nozzles being arranged in a line parallel to said predetermined direction;
an electronic-parts mounting portion for enabling the plurality of nozzles of the mounting head to mount the electronic parts on a circuit board;
first means for effecting movement to rotate the respective angular positions of said nozzles equally; and
second means for moving each of the nozzles upward and downward.

13. The electronic-parts mounting apparatus as recited in claim 12, wherein the first means includes a pinion provided on an outer circumferential surface of each of the nozzles, and a rack meshing with the pinion.

14. The electronic-parts mounting apparatus as recited in claim 13, wherein the rack includes a first rack plate, a second rack plate slidably superposed on the first rack plate, and means for urging the second rack plate relative to the first rack plate in a direction parallel to the first rack plate.

15. The electronic-parts mounting apparatus as recited in claim 14, further comprising third means for urging each of the nozzles in a direction of rotation of the nozzle.

16. The electronic-parts mounting apparatus as recited in claim 13, wherein positions of the nozzles correspond to integer multiples of a pitch of teeth of the rack respectively.

17. The electronic-parts mounting apparatus as recited in claim 12, wherein each of the nozzles includes an outer cylinder, a holder, means for rotatably supporting the outer cylinder on the holder, an inner cylinder extending into the outer cylinder and being movable upward and downward relative to the outer cylinder, a pinion provided on the outer cylinder, and further comprising a rack meshing with the pinion, and means for supporting the rack slidably on the holder.

18. The electronic-parts mounting apparatus as recited in claim 17, wherein each of the nozzles includes a coil spring provided between the outer cylinder and the holder.

19. The electronic-parts mounting apparatus as recited in claim 12, wherein the second means includes a fluid-operated actuator having a piston in engagement with an upper end of each of the nozzles.

20. The electronic-parts mounting apparatus as recited in claim 19, further comprising a limiting plate engageable with a lower end of the piston for determining a lower limit position of the piston, a first spring for urging the piston downward, and a second spring for urging the nozzle upward.

21. The electronic-parts mounting apparatus as recited in claim 19, wherein the second means includes a bearing for rotatably connecting the piston and the upper end of each of the nozzles.

* * * * *